(12) United States Patent
Wun (10) Patent No.: US 9,685,917 B1
(45) Date of Patent: Jun. 20, 2017

(54) VACUUM TUBE HIGH FIDELITY HEADPHONE

(71) Applicant: Tack Ching Wun, Ngau Chi Wan (HK)

(72) Inventor: Tack Ching Wun, Ngau Chi Wan (HK)

(73) Assignee: WATA Electronics Co., LTD, Zhongshan, Guangdong (CN)

( * ) Notice: Subject to any disclaimer, the term of this patent is extended or adjusted under 35 U.S.C. 154(b) by 0 days.

(21) Appl. No.: 15/272,264

(22) Filed: Sep. 21, 2016

(51) Int. Cl.
*H04R 27/04* (2006.01)
*H03F 3/181* (2006.01)
*H03F 3/45* (2006.01)
*H03F 3/22* (2006.01)
*H04R 1/10* (2006.01)

(52) U.S. Cl.
CPC .............. *H03F 3/181* (2013.01); *H03F 3/22* (2013.01); *H03F 3/45* (2013.01); *H04R 1/1008* (2013.01); *H04R 1/1025* (2013.01); *H04R 1/1041* (2013.01); *H04R 1/1058* (2013.01); *H03F 2203/45112* (2013.01)

(58) Field of Classification Search
CPC ...... G01S 1/02; G01S 1/72; H03F 3/28; H03J 7/042; H03J 7/20; H03J 7/22; G10H 3/187; G10H 1/0008; G10H 2220/061; G10H 1/16; G10H 1/348; G10H 2210/066; G10H 2240/311; G10H 2220/565; H04R 3/00; H04R 19/00; H04R 19/04; H04R 1/04; H04R 1/083
USPC ...... 381/74, 120, 121, 102, 103, 107; 330/3, 330/98, 100
See application file for complete search history.

(56) References Cited

U.S. PATENT DOCUMENTS

| | | | | |
|---|---|---|---|---|
| 2,327,320 | A * | 8/1943 | Shapiro | H04R 25/04 330/128 |
| 2,528,498 | A * | 11/1950 | Crownover | H03F 1/36 330/100 |
| 2,548,822 | A * | 4/1951 | Roberts | H03G 1/04 330/124 R |
| 2008/0260183 | A1 * | 10/2008 | Hertzberg | G10H 1/0008 381/119 |
| 2009/0058530 | A1 * | 3/2009 | Margolis | H03F 1/327 330/277 |
| 2016/0268986 | A1 * | 9/2016 | Otani | H03F 5/00 |

* cited by examiner

*Primary Examiner* — Lun-See Lao
(74) *Attorney, Agent, or Firm* — Jie Tan; JT Law Office (57) ABSTRACT

A hi-fi headphone device with two speakers, an integrated pentode vacuum tube, and a battery. The battery is electrically connected to direct and bias circuits, to provide proper voltage to the vacuum tube amplifiers, wherein input signal is amplified and output to buffer circuits and impedance is matched between the tube and output speaker terminals.

20 Claims, 13 Drawing Sheets

VACUUM TUBE HIGH FIDELITY HEADPHONE

BACKGROUND

The present application relates to a Hi-Fi headphone, in particular, relates to a tube Hi-Fi headset with a built-in pentode vacuum tube and battery circuit design for sound augmentation and enrichment.

Note that the points discussed below may reflect the hindsight gained from the disclosed inventions, and are not necessarily admitted to be prior art.

Headphones are commonly utilized accessories as audio output for numerous electronic products. Today's developments in digital electronic technology continue to include designs of electronic products that are equipped for headphones as listening devices for outputting audio signal. Because of the size and weight limitations, current headphone designs do not provide particularly good sound quality. Sound and music enthusiasts may not be able to use headphones alone to listen to their audio devices. Instead of the typical two-way connection between audio device and listening device, enthusiasts may need to plug in a $3^{rd}$ party device for three-way connection, such as a mini pre-amplifier, to ensure that they are hearing high-quality sound.

Many of these external amplifiers utilize semiconductor transistor amplification, these transistors lead to signal distortion and sometimes signal delay. Some of these enthusiasts prefer vacuum tube amplifiers instead of transistors for the reason that vacuum tubes produce a more authentic and high quality sound. Yet vacuum tube technology is predominantly utilized in large amplifiers.

Battery size and power consumption is a real concern in headphone design that requires compact size and light weight. Providing Hi-Fi headphone with sound enriched by a vacuum tube amplifier thus remains a challenge in the headphone industry. The CN 2041194420 and CN 202696845U describe a headset design with vacuum tube power. But these disclosures utilize old diode or triode vacuum tubes and as a result, have limited sound quality improvement. The consumption of battery also limits their use.

There is a need for improvement in headsets that provides vacuum tube-enriched sounds.

SUMMARY

The present application improves upon the current headsets by developing a headset design and electronic circuits that allow for the adoption of sub-miniature pentode vacuum valves into the amplifier circuit, providing high-quality sound output with a broad responsive sound spectrum ranging from 10 Hz to 65 kHz. The pentode vacuum tube offers a second harmonic sound to the signal output, adding a deep richness and warmth dimension to the outputted sound quality.

In one embodiment, the present headset design provides voltage regulator circuits that enable a rechargeable 3-7V Lithium polymer battery to provide a 1.5V driving voltage, a 5V power supply for a DIRECTDRIVE™ amplifier as well as a positive 26V bias voltage to a sub-miniature pentode tube, extending the battery's playtime to more than 20 hours, making it viable for providing a headphone with sounds enriched by a vacuum tube amplifier.

In one aspect of the embodiment, the present headset design offers the combination of sub-miniature pentode tube with a differential input operation amplifier having DIRECTDRIVE™ architecture with Time Division Multiple Access (TDMA) filter circuit to minimize the TDMA noise from wireless signals of portable devices, making it possible to build a portable tube Hi-Fi headphone for portable devices with wireless network connections.

In one embodiment, sub-miniature pentode tube is coupled with a DIRECTDRIVE differential input operation amplifier that produce a ground referenced output from a single supply, eliminating the need for large DC-blocking capacitors, saving board space and component height.

In one embodiment, an aperture is constructed at the center of the main PCB panel where a pin connector and a FPCB (Flexible Printed Circuit Board) is mounted and two vacuum tubes are then mounted to the FPCB and through the FPCB they connect to the main PCB.

In one aspect of the embodiment, the main PCB is made of soft and flat material to minimize the effect of mechanic vibrations.

In one aspect of the embodiment, the two vacuum tubes are further cushioned with a layer of foam between the FPCB and the glass vacuum tubes so that the FPCB and the foam function as a spring that absorbs mechanic vibrations.

In one aspect of the embodiment, the present headset design offers a built-in operational amplification circuit to output sound signals for external speakers.

BRIEF DESCRIPTION OF THE DRAWINGS

The disclosed application will be described with reference to the accompanying drawings, which show sample embodiments and which are incorporated in the specification hereof by reference, wherein.

DETAILED DESCRIPTION OF SAMPLE EMBODIMENTS

The various innovative teachings of the present application will be described with particular reference to presently preferred embodiments (by way of example, and not of limitation). The present application describes several embodiments, and none of the statements below should be taken as limiting the claims generally.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

The terms "first," "second," "third," "fourth," and the like in the description and the claims, if any, may be used for distinguishing between similar elements and not necessarily for describing a particular sequential or chronological order. It is to be understood that the terms so used are interchangeable. Furthermore, the terms "comprise," "include," "have," and any variations thereof, are intended to cover non-exclusive inclusions, such that a process, method, article, apparatus, or composition that comprises a list of elements is not necessarily limited to those elements, but may include other elements not expressly listed or inherent to such process, method, article, apparatus, or composition.

The present invention may be described herein in terms of functional block components and various processing steps. It should be appreciated that such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices.

It should be appreciated that the particular implementations shown and described herein are illustrative of the invention and its best mode and are not intended to otherwise limit the scope of the present invention in any way. Furthermore, the connecting lines shown in the various figures contained herein are intended to represent exemplary functional relationships and/or physical couplings between the various elements. It should be noted that many alternative or additional functional relationships or physical connections may be present in a practical incentive system implemented in accordance with the invention.

It further will be appreciated that users may interact with like the system via any input device such as computer s, cellular phone, digital music players etc.

Functional blocks of the block diagrams and flowchart illustrations support combinations of means for performing the specified functions, and each functional block of the block diagrams and flowchart illustrations, and combinations of functional blocks in the block diagrams and flowchart illustrations can be implemented by either special purpose, commercial available function based chips or circuits which perform the specified functions or steps, or suitable combinations of special purpose hardware and computer instructions.

As used herein, the terms "user" shall refer to any person, entity, machine, hardware, software, or business who accesses and uses the system of the invention, including consumers, retailers, manufacturers, and third-party providers.

Any suitable material may be use for making and constructing the tube headphone design. The speakers preferably have a driver impedance of bigger than 200 ohm, the example embodiment herein is provided with the driver impedance of 300 ohm. However speakers of smaller driver impedance are within the contemplation of the design where a person skilled in the art will know the necessary modifications to the circuit structure and construction to reach the best performance.

The term "headphone" refers to an over-the-head audio listening device comprised of sound emission units that rest on, over, or near the left and right ears of user, with sound emission units typically having housings that encase mounted speaker(s). Other terms, such as headset, headpiece, for the similar structured sound device may be used inter-exchangeablly.

Vacuum tubes have been replaced by semiconductors in most electronic devices, and in audio electronics, vacuum tube amplifiers also have the problem of high noise and distortion. On the other hand, the sounds of vacuum tube amplifiers have been found to follow a quadratic function distortion that offers a second harmonic, an overtone factor that is abundantly produced by many musical instruments and gives depth and richness to the sound. This quality of sound is especially very attractive to many audiophiles. However, the vacuum tube configured audio systems are traditionally very bulky, heavy, big and expensive, very difficult to handle for users. Similarly due to the bulky size of vacuum tubes and its requirement of heating up the filament, there have been no vacuum tube-configured headphones available to users. Much of the design concerns involve the use of batteries and the limited PCB board space in providing amplifier circuitry and noise filter. The current tube enriched HiFi headphone design aims to solve those problems through the combination of the mechanic design for headphone speaker house and the utilization of compact Lithium polymer battery, power manipulation circuits, the utilization of a sub-miniature pentode tube, a DIRECT-DRIVE pre-amplifier, and specifically designed PCB board configuration and mounting method of the pentode tube.

Figure 1:
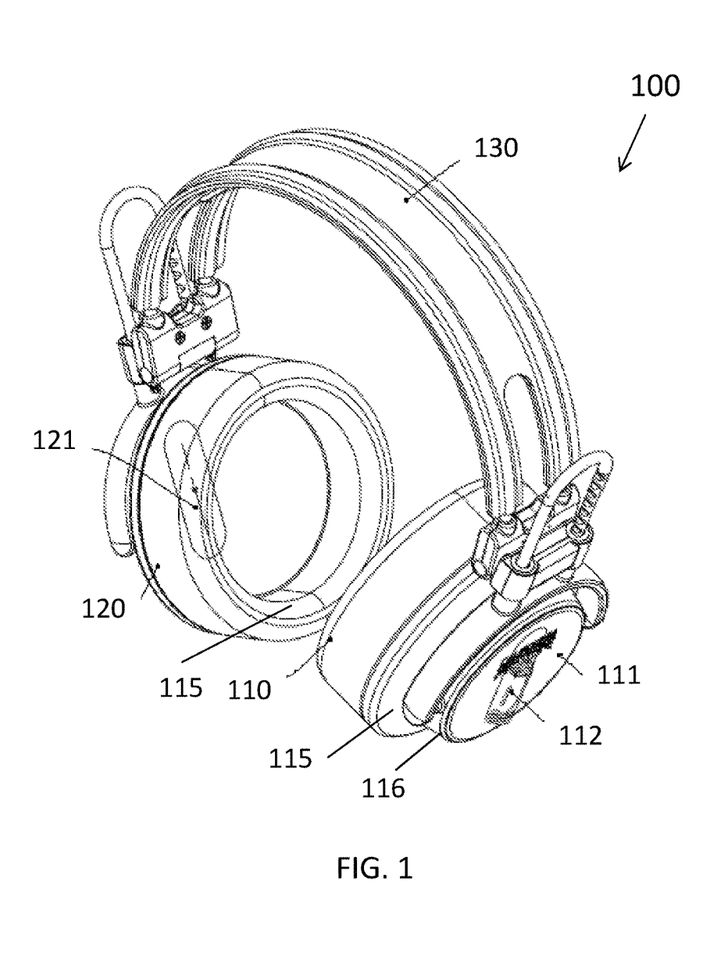
FIG. 1 shows a prospective view of an example headset design in accordance with this application.
Figure 2:
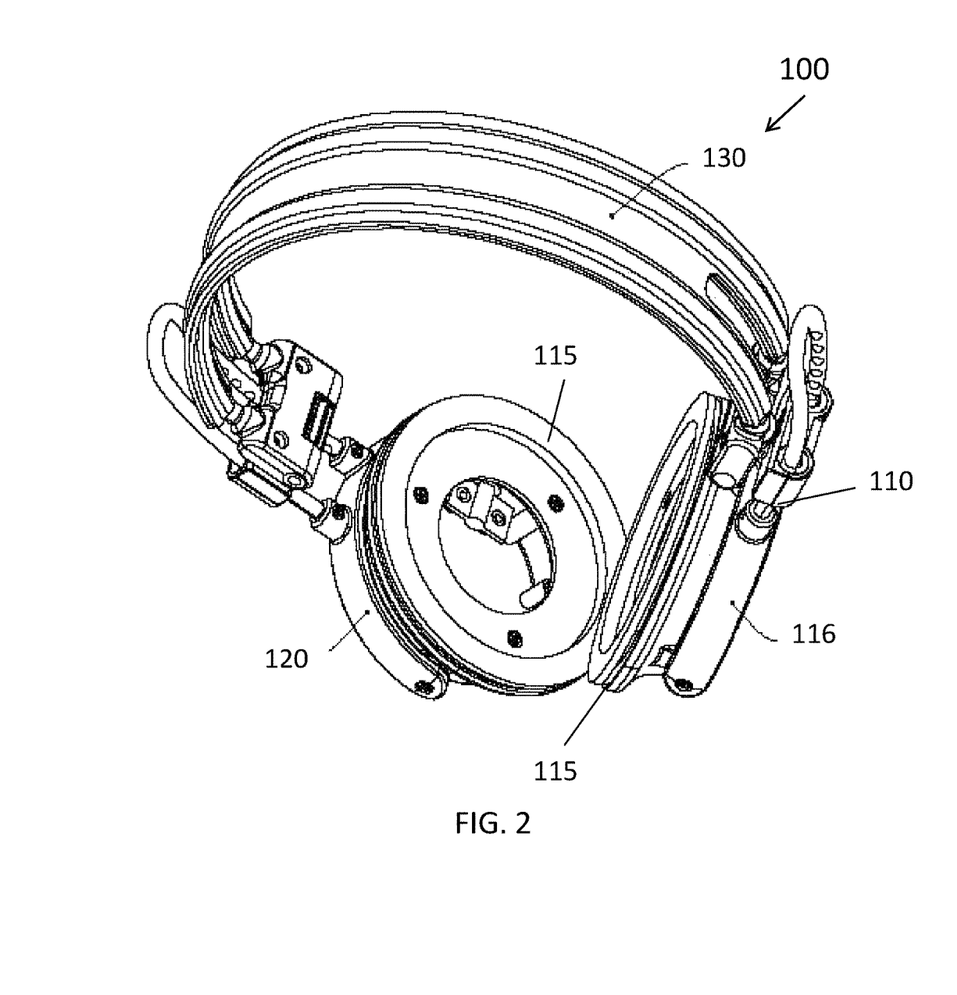
FIG. 2 shows another prospective view of an example headset design in accordance with this application.

In reference to FIGS. 1 and 2, vacuum-tube enabled headphone construction 100 includes two speaker housings 110, 120 which are connected via a headband 130. Headband 130 is configured to hold the two speaker housings to human hears and contours to a human head, may be constructed with lightweight aluminum tubular material or carbon graphite fiber materials. Headband 130 also may envelop the connection wires between the electronic parts installed inside housings 110 and 120. To light the weight, headband 130 may also be configured in the shape of rails with emptied space in between. Housings 110 and 120 are constructed with two compartment layers 115 and 116 where compartment 115 contains a speaker and compartment 116 contains wires and PCB board and battery. One end of the wires may be configured with an audio plug that can be inserted into the audio jack of a portable electronic device for receiving electronic output audio signal. The wiring and audio plugs constitute an audio signal input unit. The headset may contain a wireless transceiver unit for receiving wireless audio signals, such as a WIFI™ or BLUETOOTH™ signal receiving unit that will receive audio signal and outputs to the audio amplifier circuit and the speakers. Compartment layer 116 is also configured with a charging socket for recharging batteries. A volume control may also be built on exterior of the compartment 116.

To provide a compact headphone configuration and to minimize headphone weight, vacuum tubes 112 and battery 121 may be arranged on different sides of the headphone. Vacuum tubes 112 may be mounted within the outer wall 111 of compartment 116 of housing 110 and battery 121 may be mounted inside outer compartment of housing 120. The vacuum tube 112 includes a sealed clear glass tube and connections pins for thermal filaments, cathode, anode, and grids. The best sound results are obtained from using a sub-miniature pentode tube that has low power consumption and allows for rechargeable dry cell batteries and longer battery running time. Vacuum tube 112 may be partly exposed at the outer compartment 116, as illustrated in FIG. 1, where the glowing filament of the vacuum tube may be a decorative member of the housing 110. Battery 121 may be mounted within the outer compartment of housing 120 with cover to avoid both prolonged exposure to dry air and an undesirable appearance of the headset. Battery 121 may be responsible for both the drive voltage and bias voltage required for the vacuum tube 112 to operate. This design takes into consideration the weight on both sides of the housings 110, 120 and has them at approximately equal weight to prevent users from feeling weight imbalance.

Figure 3:
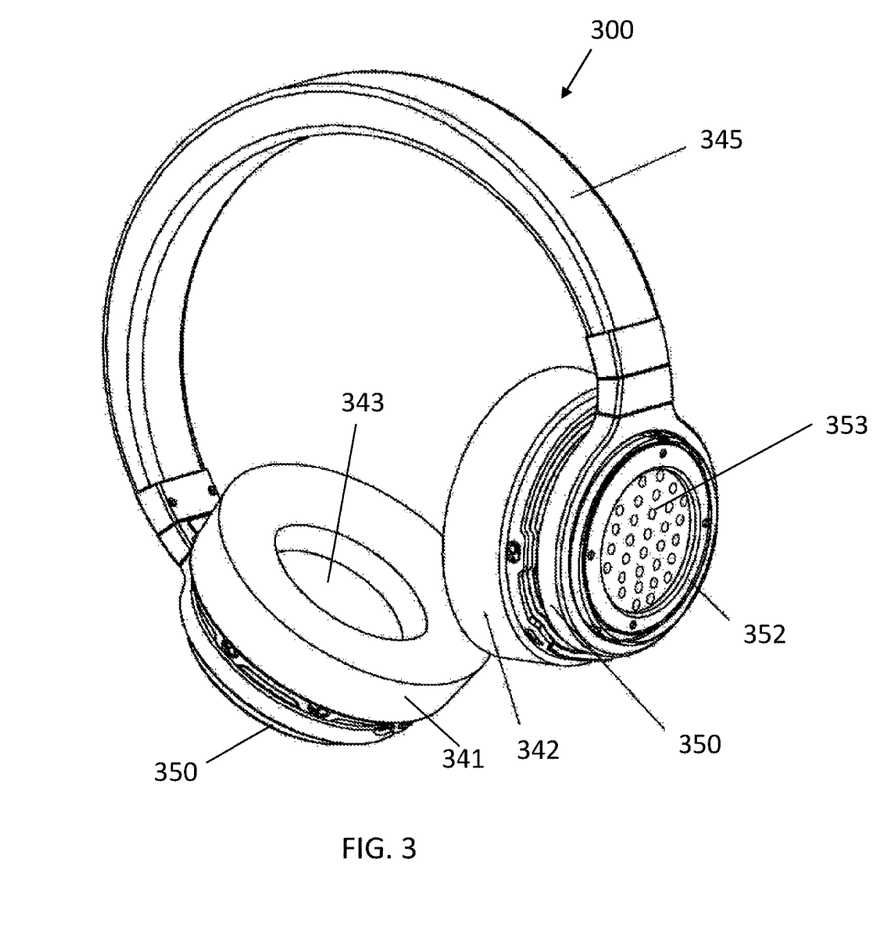
FIG. 3 shows a prospective view of another example headset design in accordance with this application.
Figure 4:
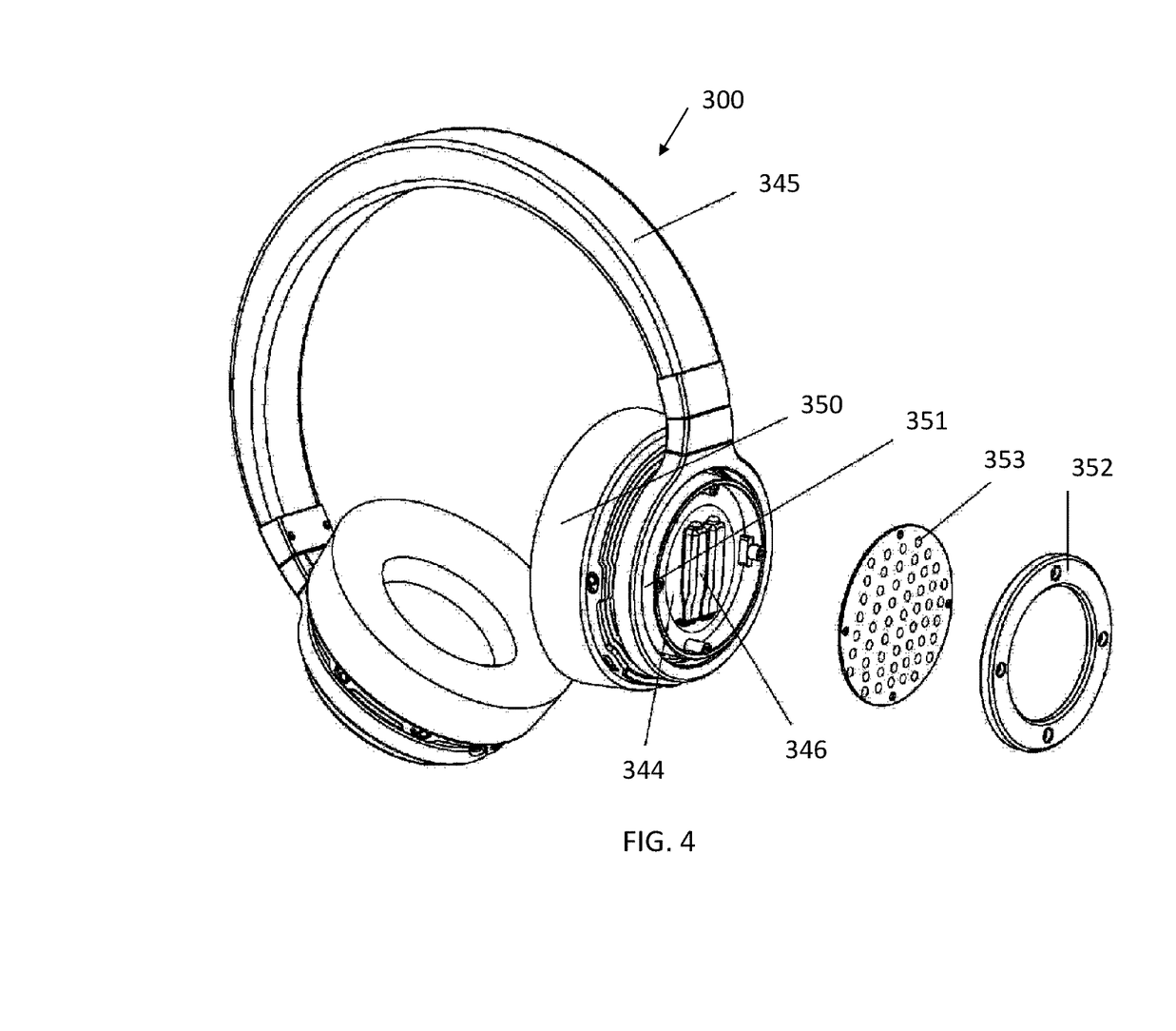
FIG. 4 shows an expanded view of speaker housing of the headset design FIG. 3 in accordance with this application.

FIGS. 3 and 4 show an alternative headphone design 300 includes housings 341 and 342 for housing the left and right speakers. Housing 341 and 342 respectively includes a chamber space 343 for speaker and a separate chamber space 350 for installing the PCB board and battery. At the exterior side of chamber space 350, removable cover 353 is mounted with a matching seal ring 352 (FIG. 4) to the chamber to allow users easy access to the space to change battery 346 or to switch to different amplifier chips. PCB 344 may be mounted in a removable way for easy cleaning and replacement. Chamber 350 also is configured with a charging socket for recharging batteries. A volume control may also be built on exterior of chamber 350. Headband 345 is configured to contour human head and to hold speaker housings 341 and 342 to human ears.

The present headphone designs are particularly configured to accommodate the installment of battery and the mounting of vacuum valves to the audio amplification electric circuit, and may be made with any suitable durable material. The described headphone designs can be made with metal, plastic, rubber or any other suitable materials, such as aluminum alloy tubular material or carbon fabric materials.

Figure 5:
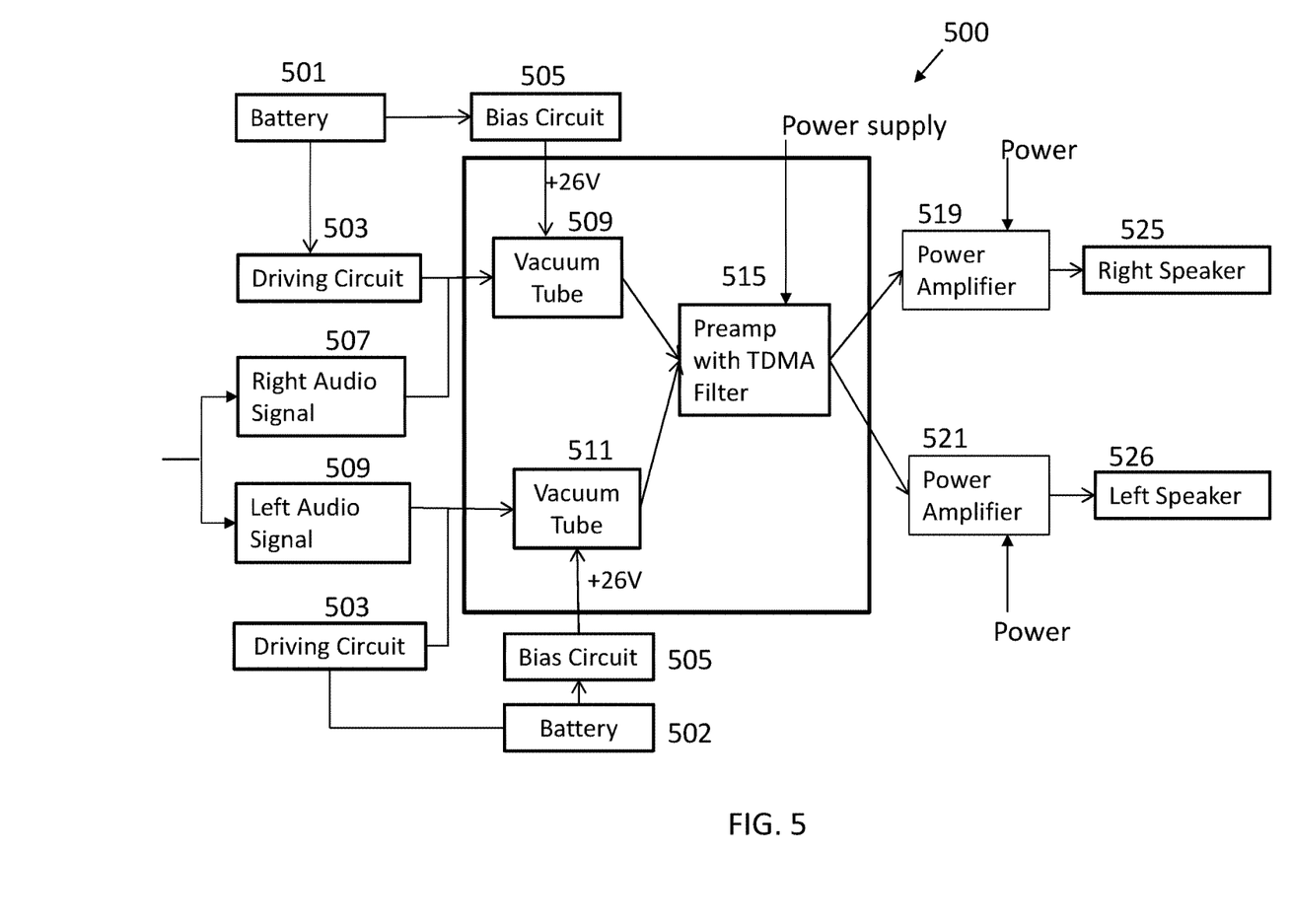
FIG. 5 illustrates an example electronic structural flow chart in accordance with this application.

In order to provide a headphone that produces high fidelity sounds with warmth and depth and in broad response frequency, sub-miniature pentode vacuum tubes are integrated into the amplification circuit structure. FIG. 5 illustrates an example electric functional structure 500 powered by compact sized batteries for headphone designs 100 and 300. Electric structure 500 comprises battery 501 connected to a driving circuit 503 and a bias circuit 505 that convert the DC voltage of the battery into suitable voltage for vacuum valves. The pre-amplification circuit 515 is configured with TDMA filter to allow the headphone be used with a wireless device. Power amplifier 519 is provided with additional voltage +5V and −5V power to boost the gain ratio in amplification. This additional power design also increases the headphone's dynamic range of music and improves the CMMR (the common-mode rejection ratio). The CMRR is the ratio of the powers of the differential gain over the common-mode gain, measured in positive decibel. As the noise from the environment appears as an offset on both input leads, noise usually is a common-mode voltage signal, the CMMR of the headphone determines the attenuation applied to offset noise. In order for the headphone to be light weight and compact in size, battery 501 may be preferably a 3-7V rechargeable Li polymer battery that has a soft package shape, and the preferred vacuum tube 509 is a sub-miniature pentode tube, such as Raytheon JAN6418 that is known for very low power consumption where the heating of the filament only requires 1.5V.

Figure 6A:
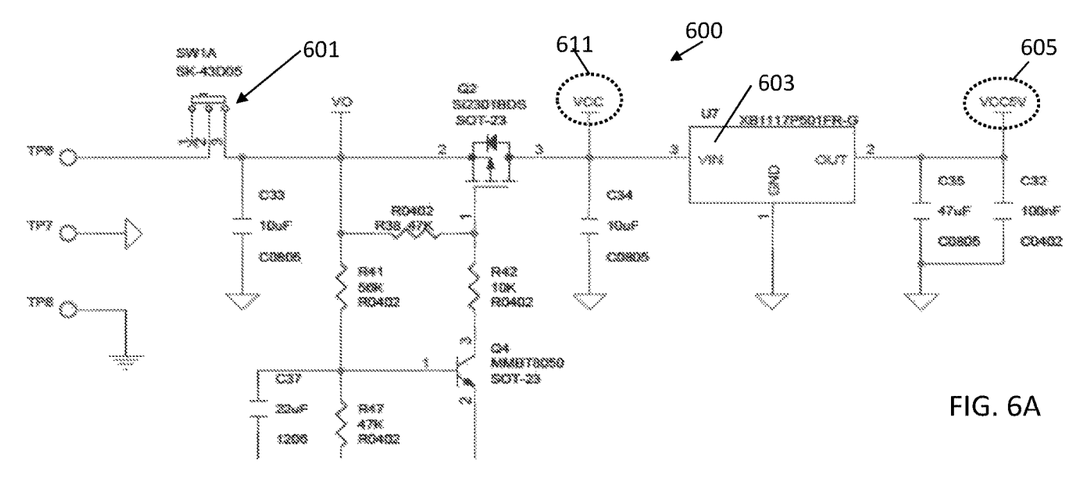
FIG. 6A shows an example voltage circuitry structure for providing power supply for DIRECTDRIVE amplifier in accordance with this application.
Figure 6B:
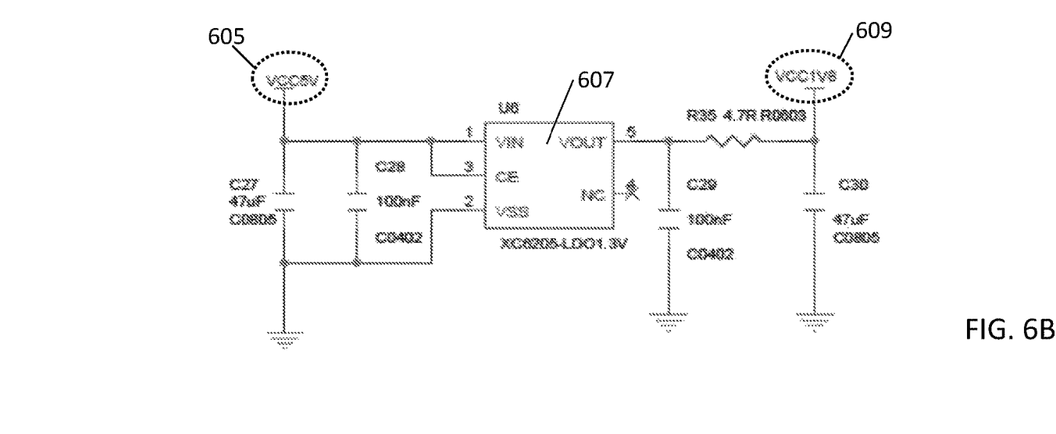
FIG. 6B shows an example voltage circuitry structure for driving tube filament in accordance with this application.
Figure 6C:
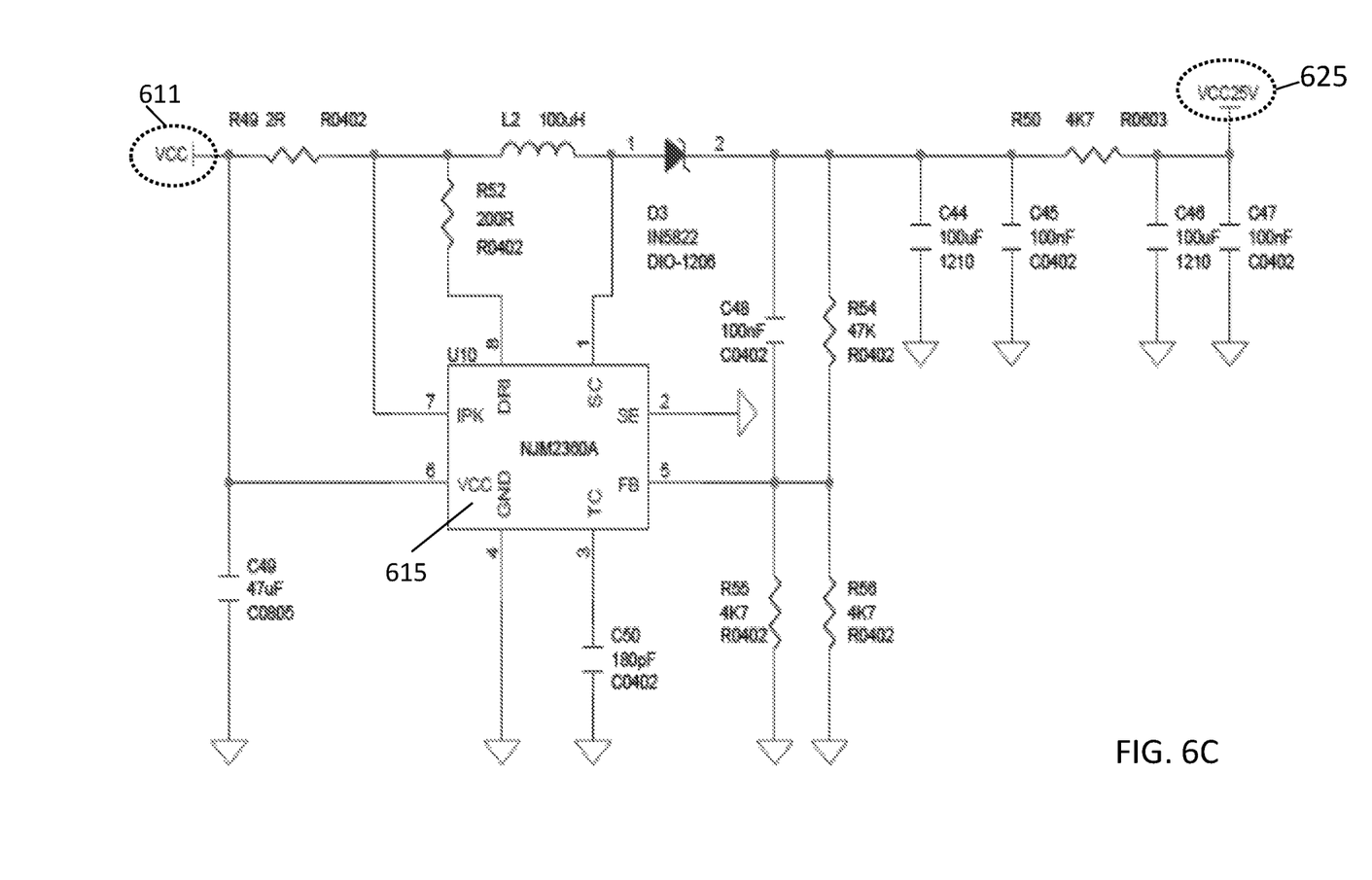
FIG. 6C shows an example voltage circuitry structure for providing a bias voltage for the vacuum tube in accordance with this application.

In order to save space and provide sound quality, series of power designs are contemplated and utilized for various chip circuits. FIGS. 6A, 6B and 6C show example series of power designs to achieve the required sound effect. The multiple power supplies are required so that both the pre-amplifier and power amplifier circuit are provided with a separate power supply to achieve a ground-referenced output for the pre-amplification with the omission of the requirement of additional linear regulator, increasing the dynamic range of music and higher CMMR ratio. The multiple power designs are integrated into the whole circuit. FIG. 6A shows an initial circuit 600 that provides a VCC voltage 611 for bias circuit 620 shown in FIG. 6C and converts the power from the battery into a VCC 5V voltage 605 which is used for other voltage conversion. Circuit 600 contains a power switch 601, a voltage regulator circuit 603 that generates a 5V voltage output 605. As shown in FIG. 6B, the 5V of VCC 605 is then provided to the power circuit 610 which further includes a voltage regulator 607 which converts the 5V input into 1.8V VCC voltage 609. 1.8V voltage 609 is then provided to drive the filament of the sub-miniature pentode tube in FIG. 7. The 5V of VCC 605 may be further converted into a negative 5V by an inverting charging pump chip (circuit not shown) which can be used for power input for the power amplifier in FIG. 9A.

Shown in FIG. 6C, VCC 611 is further boosted into a 25V bias voltage 625 via voltage converter chip 615 in circuit 620. The 25V bias voltage 625 is applied to the anode side of pentode 701 structure shown in FIG. 7. This positive bias voltage is applied to have sufficient pre-amplification gain and TDMA filtration to provide input for next stage of later power amplification.

Figure 7:
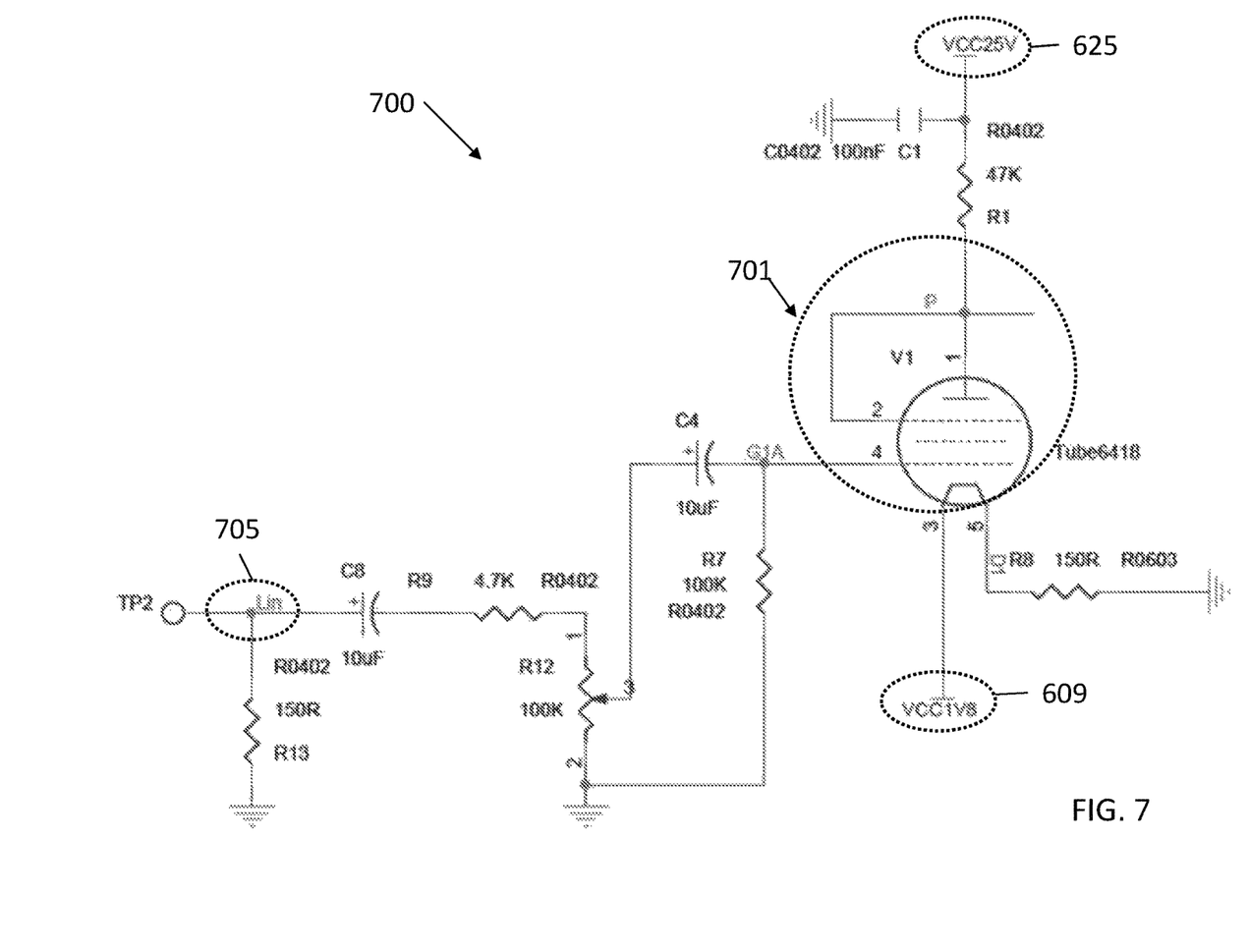
FIG. 7 shows an example circuitry structure for utilizing sub-miniature pentode tube in signal amplification channels in accordance with this application.

In reference to FIG. 7, signal input circuit design 700 for the left audio channel having a built-in a pentode vacuum tube in the signal amplification path is shown. The circuit design for the right audio channel is not shown that may be identical to the left channel. Pentode tube 701 in the example shows the structure of sub-miniature pentode tube Raytheon JAN6418 where the suppressor grid 5 and cathode 3 are internally linked together and a filament driving voltage 1.8V is supplied by VCC voltage 609. Input signal wire circuit 705 is connected to the control grid 4, and screen grid 2 is connected to the anode 1. Audio signal input travels through control grid 4 and is amplified in the vacuum tube structure. The amplification is enhanced with the +25V bias voltage 625. The output signal is filtered through linear regulator load and bridge-tied load such as 809 in FIG. 8.

Figure 8:
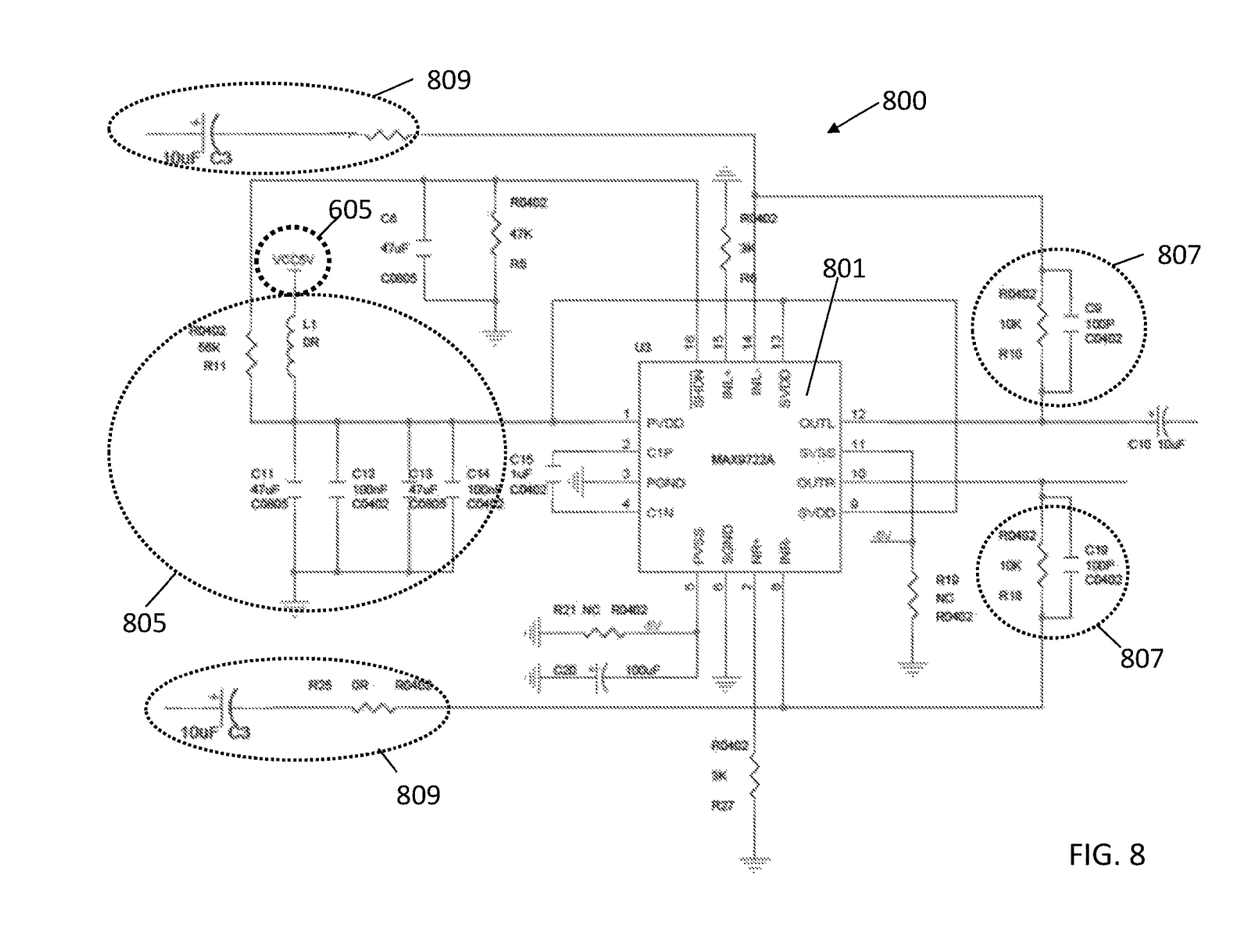
FIG. 8 shows an example pre-amplification circuity having TDMA filter in accordance with this application.

In reference to FIG. 8, the signals from the pentode vacuum 701 are further amplified through a DIRECTDRIVE™ amplifier 801, preferably MAX9722A by Maxim Integrated Products, which uses a unique DIRECTDRIVE™ architecture to produce a ground-referenced output from a single supply, eliminating the need for large DC-blocking capacitors. The 5V of VCC 605 is used to provide the charge-pump power supply which inverts the positive supply into a negative supply. The amplifiers inside the circuitry operate from these bipolar supplies with their outputs biased about GND, therefore the amplifier outputs do not have a DC component, eliminating the requirement of large DC-blocking capacitors. Various filtering circuits 805, 809, 807 are designed to filtering out the TDMA noises from a wireless player, such as a cell phone or an IPOD.

Figure 9A:
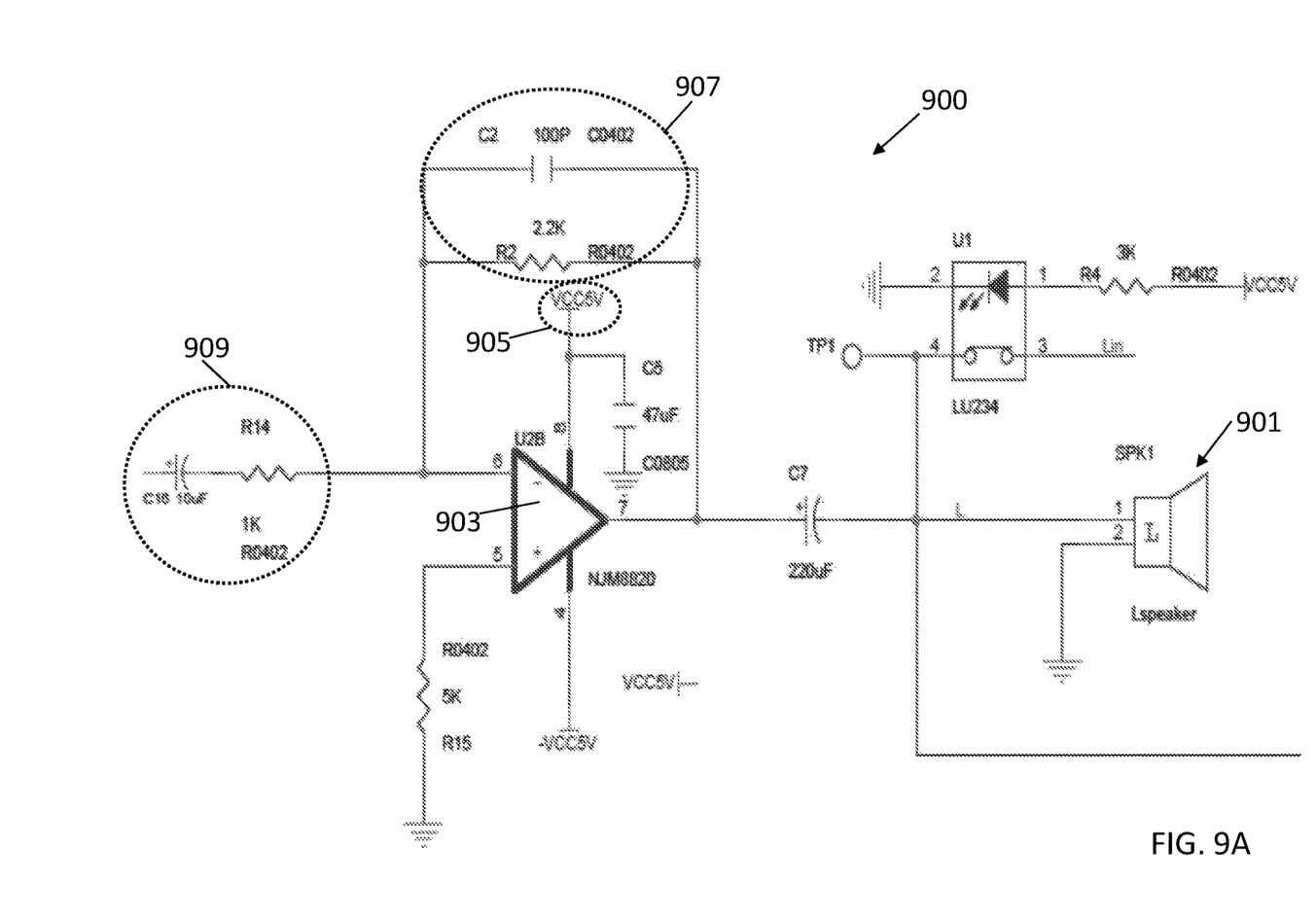
FIG. 9A shows an example power amplifier circuity before a speaker in accordance with this application.
Figure 9B:
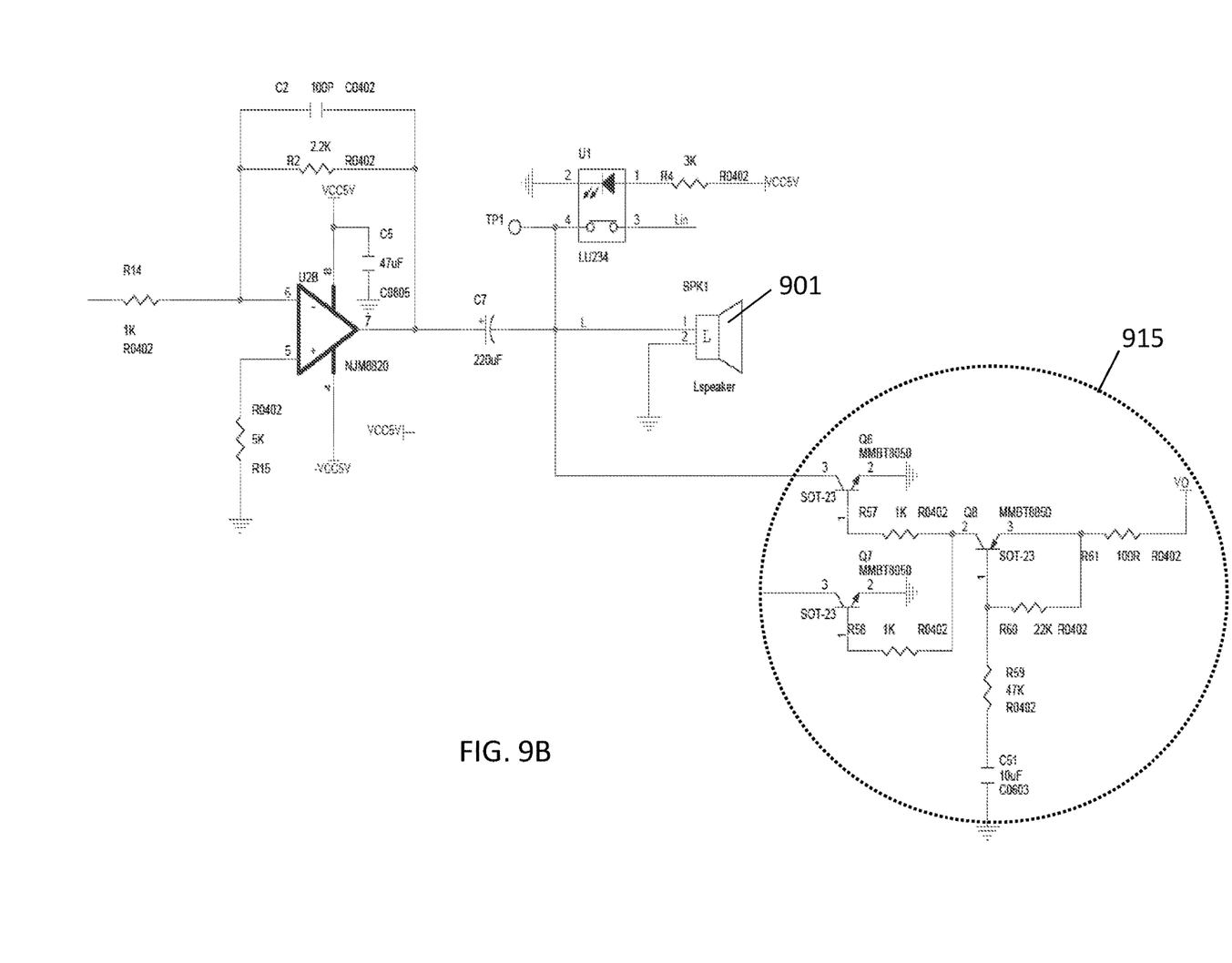
FIG. 9B shows an example power amplifier circuity before a speaker having a built-in operational amplification output in accordance with this application.

In reference to FIG. 9A an example circuit design 900 for a power amplifier and left speaker is shown left is illustrated. The right speaker channel is usually identical to the left speaker channel. The power filter 903 is shown to be supplied with positive 5V and negative 5V bias voltages. Bridge load connection 907 is configured to filter noises. The impedance of speaker 901 is matched with output of the amplifier 903. FIG. 9B shows an alternative configuration that also includes an additional amplification and filtration 915 where an external speaker may be connected to.

Additionally an 8-pin socket may be installed on the PCB so that users can plug-in other commercially available OP-amps to enjoy a different sound. For example, a user can plug-in MUSES8820 for a neutral to warm and well bodies and textured sound, or MUSES8920 for a sharper sound, or MUSES02 for a refined and wider sound, or LM4562 for airy and open sound, or OPA2604 for tubish, warm and weighty sound, or AD8066 for sharp sound on treble, or AD8397 for neutral, fairly rounded sound, or OPA2209 for more dynamic and grainer sound.

The illustrated circuit designs generates a high fidelity headphone that has a frequency response ranging from 10 Hz to 65 kHz, with a driver impedance of 300 ohm and a playtime of approximately 20 hours with 3-7v rechargeable Li-polymer batteries.

Tube gears are apt to produce microphonics due to the heating noise of the filament and mechanic impact on the tube. This is so even when the tube amplifier is installed in a protected box. In order to minimize the mechanic impact on the tube to allow a listener to wear it on the head, the PCB board and the tubes are mounted as shown in FIGS. 10A, 10B and 10C.

Figure 10A:
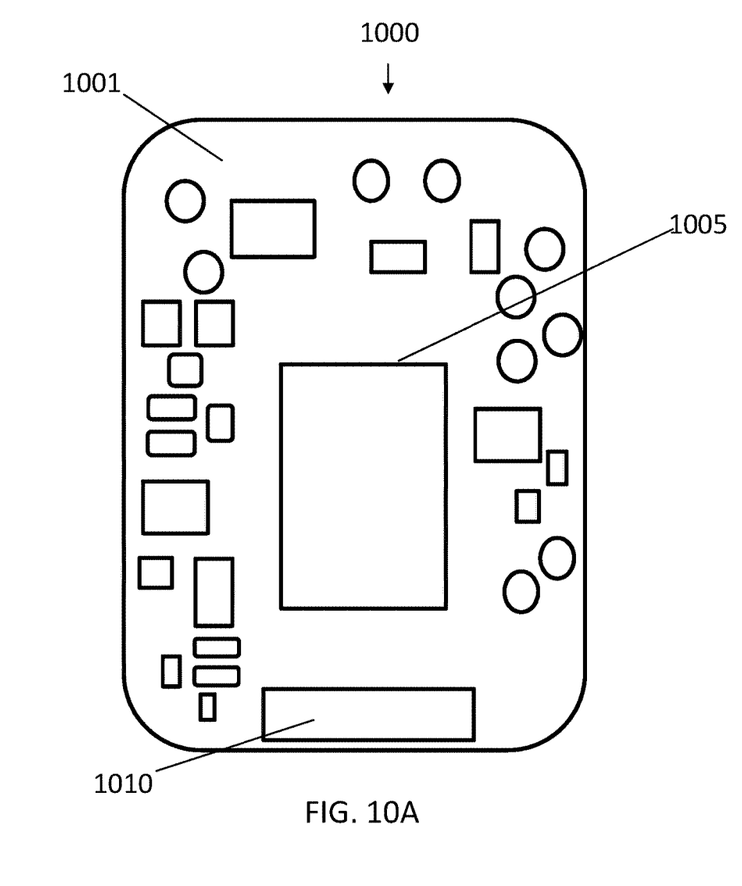
FIG. 10A shows a top view of an example PCB with an aperture mechanic configuration for mounting a vacuum tube in accordance with this application
Figures 10B, 10C:
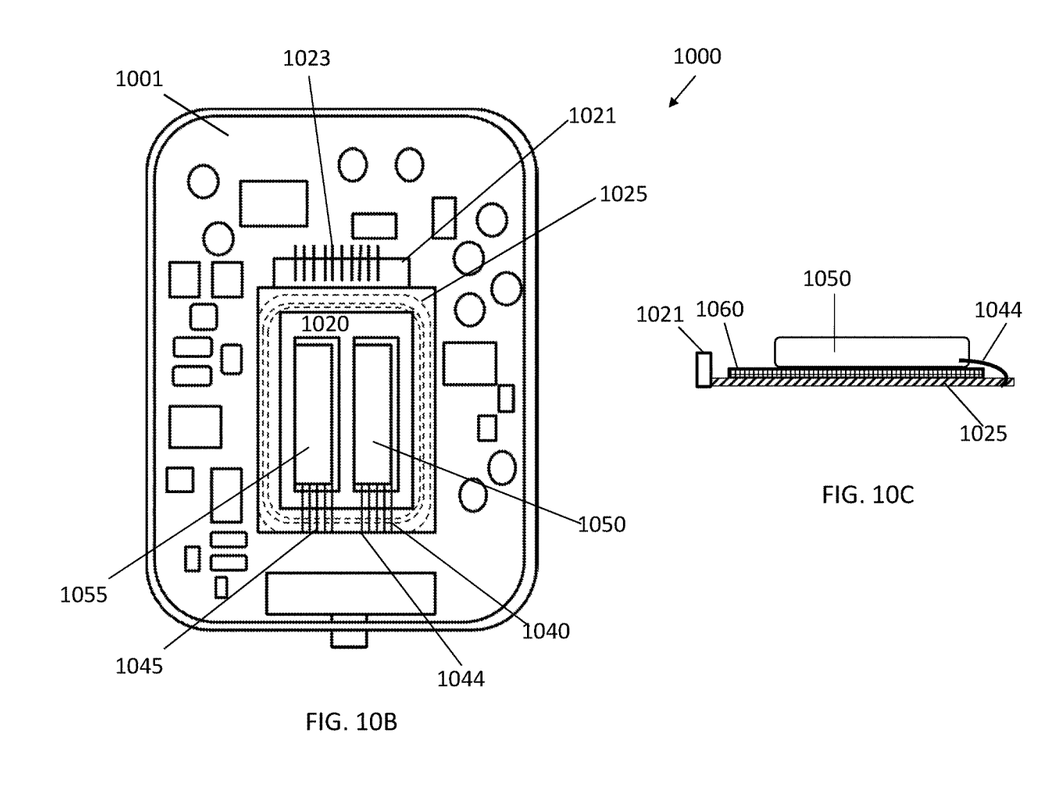
FIG. 10B shows a top view of an example printed circuit board mounted with vacuum tubes through FPCB structure in accordance with this application.
FIG. 10C shows a sectional view of a mounted with vacuum tubes through FPCB structure in accordance with this application.

In reference FIG. 10A, the main PCB board construct 1000 includes a PCB board panel 1001 mounted with various electronic parts that are linked with printed circuits as described in detail above. In the middle of board panel 1001, an aperture 1005 is constructed to mount the tube construct which is independently printed on a FPCB. 1010 is a volume control or power switch. To minimize any effect from mechanical vibration board panel 1001 is preferred to be made of flat and soft materials, such as cotton papers. FIG. 10B shows a top view of fully mounted PCB board construct 1000 that further includes tube construct 1025 mounted at the center opening area of board panel 1001. Tube construct 1025 further includes a FPCB panel 1020, a connector head piece 1021, printed circuit 1040, and pentode vacuum tube 1055 and pentode vacuum tube 1050. The two tubes are connected to the FPCB circuit through their connecting legs 1045 and 1044. Tube construct 1025 connects to the main PCB board panel 1001 through connecting pins 1023. FIG. 10C shows a sectional view of tube construct 1025 where vacuum tube 1050 (tube 1055 is not shown) is mounted levelly on FPCB (Flexible Printed Circuit Board) circuit board 1025 cushioned in between is a layer of foam material 1060. With vacuum tubes being mounted specifically as such any mechanic vibrations are absorbed and the microphonic effects on the vacuum tubes caused by mechanic vibrations are minimized. Such configuration thus makes it possible to build a HIFI headphone with vacuum tube's audio richness and warmth.

The above headset comprises a housing, wherein the speakers are mounted within the housing, wherein the housing is provided with an audio signal input unit, wherein the a battery and vacuum tube with cushion are mounted within the housing, wherein the battery voltage is electrically connected to the driving circuit and the bias circuit, providing voltage to the tube, wherein the vacuum input unit receives an audio signal and outputs signal to the loudspeaker. The combination of low power consuming sub-miniature pentode tube with ultra-low noise and ultra-low distortion amplifier circuit allows the construction of a HIFI headphone that has a 10 Hz-65 kHz frequency response range, high driver impedance and added sound richness from second harmonic generated by the vacuum tubes.

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke 35 USC section 112(f) unless the exact words "means for" are followed by a participle. The claims as filed are intended to be as comprehensive as possible, and NO subject matter is intentionally relinquished, dedicated, or abandoned.

What is claimed:
1. A high fidelity headphone having a left speaker housing and a right speaker housing, comprising:
 a lithium polymer battery;
 a speaker; and
 an operational amplifier circuit further comprising:
  a sub-miniature pentode vacuum tube having a filament, a cathode, a control grid, a screen grid and an anode;
  a driving circuit for converting voltage from said battery into a sufficient driving voltage for heating said filament;
  a bias circuit for converting voltage from said battery into a bias voltage to be applied to said control grid;
  a signal input circuit for receiving audio signal from a digital electronic source, connected with said control grid; and
   wherein said sub-miniature pentode vacuum tube is independently mounted on a FPCB panel.
2. The high fidelity headphone of claim 1, wherein said sub-miniature pentode vacuum tube is RAYTHEON JAN6418.

3. The high fidelity headphone of claim 2, wherein said bias voltage is about 18-25V.

4. The high fidelity headphone of claim 1, wherein said battery is a 3-7V rechargeable Li-polymer battery.

5. The high fidelity headphone of claim 1, wherein said driving circuit, said bias circuit, and said signal input circuit are built on a main PCB panel having an aperture wherein said FPCB panel is mounted at said aperture and connected to said main PCB through a connector structure.

6. The high fidelity headphone of claim 5, wherein said left speaker housing or said right speaker housing has a first chamber and a second chamber wherein said speaker is disposed in said first chamber, and said main PCB panel is disposed in the second chamber wherein said second chamber includes a removable cover for allowing access to said main PCB panel.

7. The high fidelity headphone of claim 5, wherein said FPCB is removable from the main PCB by un-plugging from the connector on the main PCB panel.

8. The high fidelity headphone of claim 1, wherein said sub-miniature pentode vacuum tube is cushioned with a layer of foam between said FPCB panel and said sub-miniature pentode vacuum tube.

9. The high fidelity headphone of claim 1, further comprising a differential amplifier having a DIRECTDRIVE™ architecture configured with TDMA filter and said anode is connected to said differential amplifier for signal pre-amplification.

10. The high fidelity headphone of claim 9, further comprising a power amplifier that accepts signal output from said differential amplifier.

11. A high fidelity headphone having a left speaker housing and a right speaker housing, comprising:
    a speaker; and
    an operational amplifier circuit, further comprising:
        a sub-miniature pentode vacuum tube having a filament, a cathode, a control grid, a screen grid and an anode;
        a driving circuit for converting voltage from said battery into a sufficient driving voltage for heating said filament;
        a bias circuit for converting voltage from said battery into a bias voltage to be applied to said control grid;
        a signal input circuit for receiving audio signal from a digital electronic source, connected with said control grid; and
        wherein said sub-miniature pentode vacuum tube is independently mounted on a FPCB panel.

12. The high fidelity headphone of claim 11, further comprising a lithium polymer battery as power supply.

13. The high fidelity headphone of claim 12, wherein said battery is a 3-7V rechargeable Li-polymer battery.

14. The high fidelity headphone of claim 11, wherein said sub-miniature pentode vacuum tube is RAYTHEON JAN6418.

15. The high fidelity headphone of claim 14, wherein said bias voltage is about 18-25V.

16. The high fidelity headphone of claim 11, wherein said driving circuit, said bias circuit, and said signal input circuit are built on a main PCB panel having an aperture wherein said FPCB panel is mounted at said aperture and connected to said main PCB through a connector structure.

17. The high fidelity headphone of claim 16, wherein said left speaker housing or said right speaker housing has a first chamber and a second chamber wherein said speaker is disposed in said first chamber, and said main PCB panel is disposed in the second chamber wherein said second chamber includes a removable cover for allowing access to said main PCB panel.

18. The high fidelity headphone of claim 17, wherein said FPCB is removable from the main PCB by un-plugging from the connector on the main PCB panel.

19. The high fidelity headphone of claim 11, further comprising a differential amplifier having a DIRECTDRIVE™ architecture configured with TDMA filter and said anode is connected to said differential amplifier for signal pre-amplification.

20. The high fidelity headphone of claim 11, wherein said sub-miniature pentode vacuum tube is cushioned with a layer of foam between said FPCB panel and said sub-miniature pentode vacuum tube.

\* \* \* \* \*